U S 011348852 B 2

(12) United States Patent
Takizawa

(10) Patent No.: US 11,348,852 B2
(45) Date of Patent: May 31, 2022

(54) SEMICONDUCTOR DEVICE

(71) Applicant: FUJI ELECTRIC CO., LTD., Kawasaki (JP)

(72) Inventor: Naoki Takizawa, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 24 days.

(21) Appl. No.: 17/107,541

(22) Filed: Nov. 30, 2020

(65) Prior Publication Data

US 2021/0082780 A1 Mar. 18, 2021

Related U.S. Application Data

(63) Continuation of application No. PCT/JP2019/042966, filed on Nov. 1, 2019.

(30) Foreign Application Priority Data

Dec. 10, 2018 (JP) .............................. JP2018-230623

(51) Int. Cl.
*H01L 23/12* (2006.01)
*H01L 23/36* (2006.01)
(Continued)

(52) U.S. Cl.
CPC .............. *H01L 23/12* (2013.01); *H01L 23/36* (2013.01); *H01L 25/072* (2013.01); *H01L 25/18* (2013.01);
(Continued)

(58) Field of Classification Search
CPC ....... H01L 23/12; H01L 23/36; H01L 25/072; H01L 25/18; H01L 24/48; H01L 2224/48137
See application file for complete search history.

(56) References Cited

U.S. PATENT DOCUMENTS 5,793,106 A 8/1998 Yasukawa et al.
8,847,384 B2 * 9/2014 Yoon ..................... H01L 23/562
165/80.2
(Continued)

FOREIGN PATENT DOCUMENTS

JP H08236667 A 9/1996
JP 2003051560 A 2/2003
(Continued)

*Primary Examiner* — Peniel M Gumedzoe
(74) *Attorney, Agent, or Firm* — Rabin & Berdo, P.C.

(57) ABSTRACT

A semiconductor device includes an insulating circuit substrate including an insulating plate, a first metal layer formed on a top surface of the insulating plate, and a second metal layer formed on a bottom surface of the insulating plate, a heatsink on whose top surface the insulating circuit substrate is disposed; semiconductor elements disposed on the top surface of the first metal layer through a bonding material, and a case that encloses a perimeter of the insulating circuit substrate and the semiconductor elements. The first metal layer includes circuit patterns electrically connected to the semiconductor elements and an annular pattern formed to enclose the perimeter of the circuit patterns with a gap provided with respect to the circuit patterns. The second metal layer is disposed at a spot that surfaces the annular pattern. The housing is affixed to the annular pattern through an adhesive.

14 Claims, 6 Drawing Sheets

(51) Int. Cl.
  *H01L 25/07* (2006.01)
  *H01L 25/18* (2006.01)
  *H01L 23/00* (2006.01)

(52) U.S. Cl.
  CPC .... *H01L 24/48* (2013.01); *H01L 2224/48137* (2013.01)

(56) References Cited

U.S. PATENT DOCUMENTS

| | | |
|---|---|---|
| 2003/0178747 A1 | 9/2003 | Bast et al. |
| 2015/0115282 A1 | 4/2015 | Takahashi et al. |
| 2015/0303126 A1 | 10/2015 | Takahashi et al. |
| 2016/0315023 A1 | 10/2016 | Yoshida et al. |
| 2016/0365298 A1 * | 12/2016 | Yamada .............. H01L 23/3735 |
| 2018/0151534 A1 | 5/2018 | Kuroyanagi |

FOREIGN PATENT DOCUMENTS

| | | |
|---|---|---|
| JP | 2003258150 A | 9/2003 |
| JP | 2003526208 A | 9/2003 |
| JP | 2014096461 A | 5/2014 |
| JP | 2015088653 A | 5/2015 |
| JP | 2015216349 A | 12/2015 |
| JP | 2016207910 A | 12/2016 |
| JP | 2017228811 A | 12/2017 |
| JP | 2018085490 A | 5/2018 |

* cited by examiner

SEMICONDUCTOR DEVICE

CROSS REFERENCE TO RELATED APPLICATIONS

This application is a continuation application of PCT/JP2019/042966, filed on Nov. 1, 2019, which is in turn based upon and claims the benefit of priority to the Japanese Patent Application No. 2018-230623, filed on Dec. 10, 2018. The entire contents of these applications are incorporated herein by reference.

BACKGROUND OF THE INVENTION

Technical Field

The present invention relates to a semiconductor device.

Background Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters. Semiconductor devices of this type are configured with semiconductor elements like the above disposed on a metal foil formed on the surface of an insulating substrate. The semiconductor elements are affixed onto the metal foil through a bonding material such as solder, for example.

An IGBT module of the related art has been proposed in which an insulating substrate is disposed on the top face of a copper base that acts as a heat radiation plate, and semiconductor elements are disposed and bonded to the top face of the insulating substrate with solder. However, demand is rising for improvements such as smaller packages, higher heat resistance, and longer lifetimes. For example, to achieve smaller packages, it is conceivable to mount devices at higher densities, but since this also increases the density of generated heat, further improvements in heat dissipation are demanded. Also, to increase heat dissipation, it is effective to thin out or reduce heat-resistant parts. As an example, a so-called copper base-less configuration, in which the copper base that acts as a heat radiation plate is eliminated, has been practically implemented (for example, see Patent Literatures 1 and 2).

In the insulating substrate described in Patent Literatures 1 and 2, a metal pattern is formed on the top face of a substrate (ceramic substrate), and a metal film is formed on the bottom face of the substrate. Also, in Patent Literatures 1 and 2, a case that covers the insulating substrate and semiconductor elements is made to adhere directly to the outer perimeter of the substrate.

CITATION LIST

Patent Literature

[Patent Literature 1] Japanese Patent Laid-Open No. 2015-216349
[Patent Literature 2] Japanese Patent Laid-Open No. 2017-228811

SUMMARY OF INVENTION

Technical Problem

However, in Patent Literatures 1 and 2, securing an adhesion area for the case requires moving the metal pattern on the substrate toward the center of the substrate. As a result, the volume difference between the metal pattern on the top face side and the metal film on the bottom face side is expected to increase. In this case, a shear stress is produced due to the difference in the amount of deformation in response to heat change between the top face side and the bottom face side of the substrate, and the problem of lower durability may occur.

The present invention has been devised in light of such points, and one object thereof is to provide a semiconductor device capable of achieving heat dissipation and durability simultaneously.

Solution to Problem

A semiconductor device according to one aspect of the present invention comprises: an insulating circuit substrate including an insulating plate, a first metal layer formed on a top face of the insulating plate, and a second metal layer formed on a bottom face of the insulating plate; a semiconductor element disposed on a top face of the first metal layer through a bonding material; and a housing that encloses a perimeter of the insulating circuit substrate and the semiconductor element, wherein the first metal layer includes a circuit layer electrically connected to the semiconductor element and an annular layer formed to enclose a perimeter of the circuit layer with a gap provided with respect to the circuit layer, the second metal layer has a first depression depressed toward the insulating plate at a spot that faces the annular layer, and the housing is affixed to the annular layer through an adhesive.

A semiconductor device according to another aspect of the present invention comprises: an insulating circuit substrate including an insulating plate, a first metal layer formed on a top face of the insulating plate, and a second metal layer formed on a bottom face of the insulating plate; a semiconductor element disposed on a top face of the first metal layer through a bonding material; and a housing that encloses a perimeter of the insulating circuit substrate and the semiconductor element, wherein the first metal layer includes a circuit layer electrically connected to the semiconductor element, and an annular layer formed to enclose a perimeter of the circuit layer with a gap provided with respect to the circuit layer, the annular layer has a second depression depressed toward the insulating plate, and the housing is affixed to the annular layer through an adhesive.

Advantageous Effects of Invention

According to the present invention, heat dissipation and durability can be achieved simultaneously.

DESCRIPTION OF EMBODIMENTS

Figure 1:
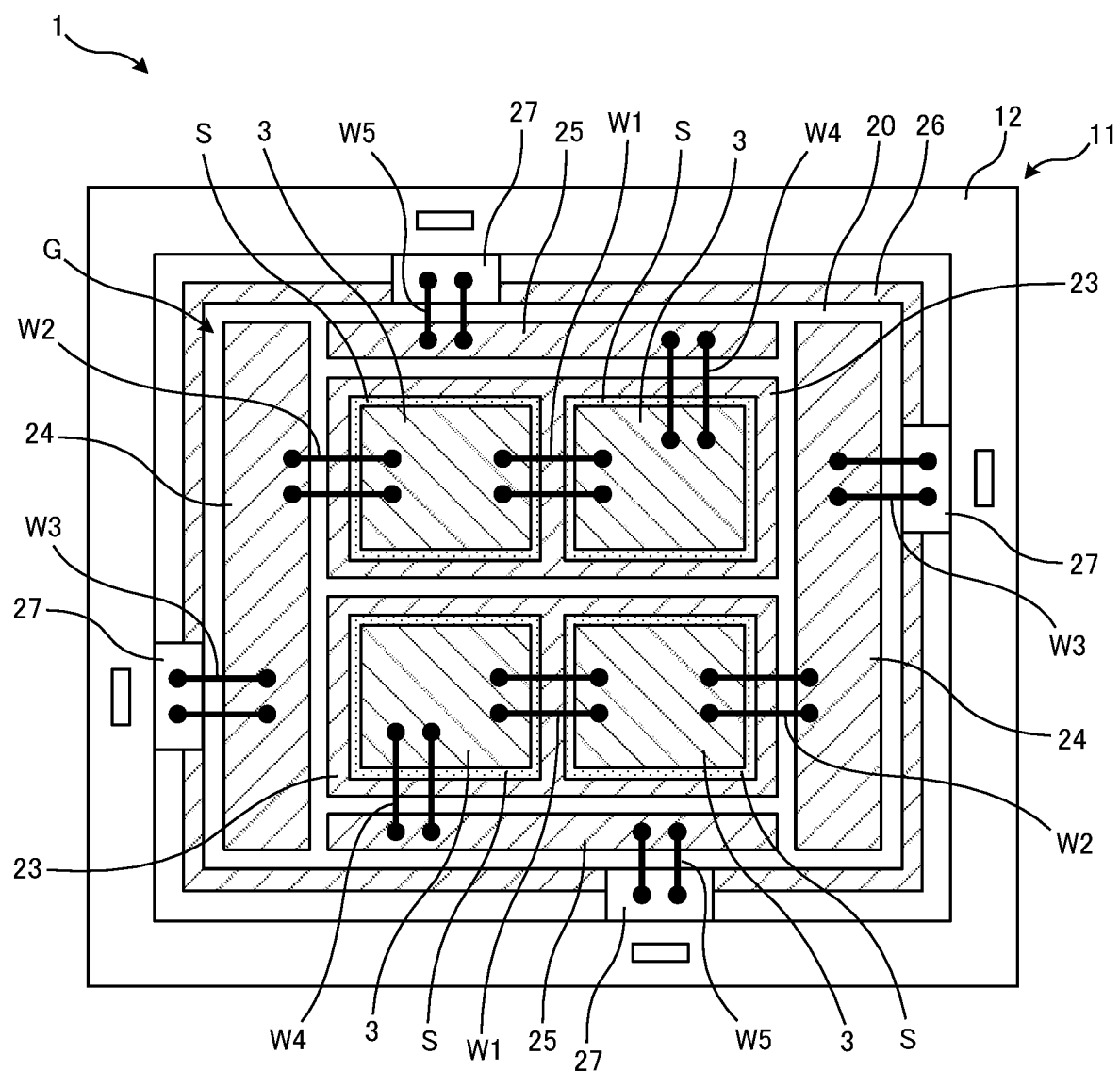
FIG. 1 is a schematic plan view illustrating one example of a semiconductor device according to the embodiment.
Figure 2:
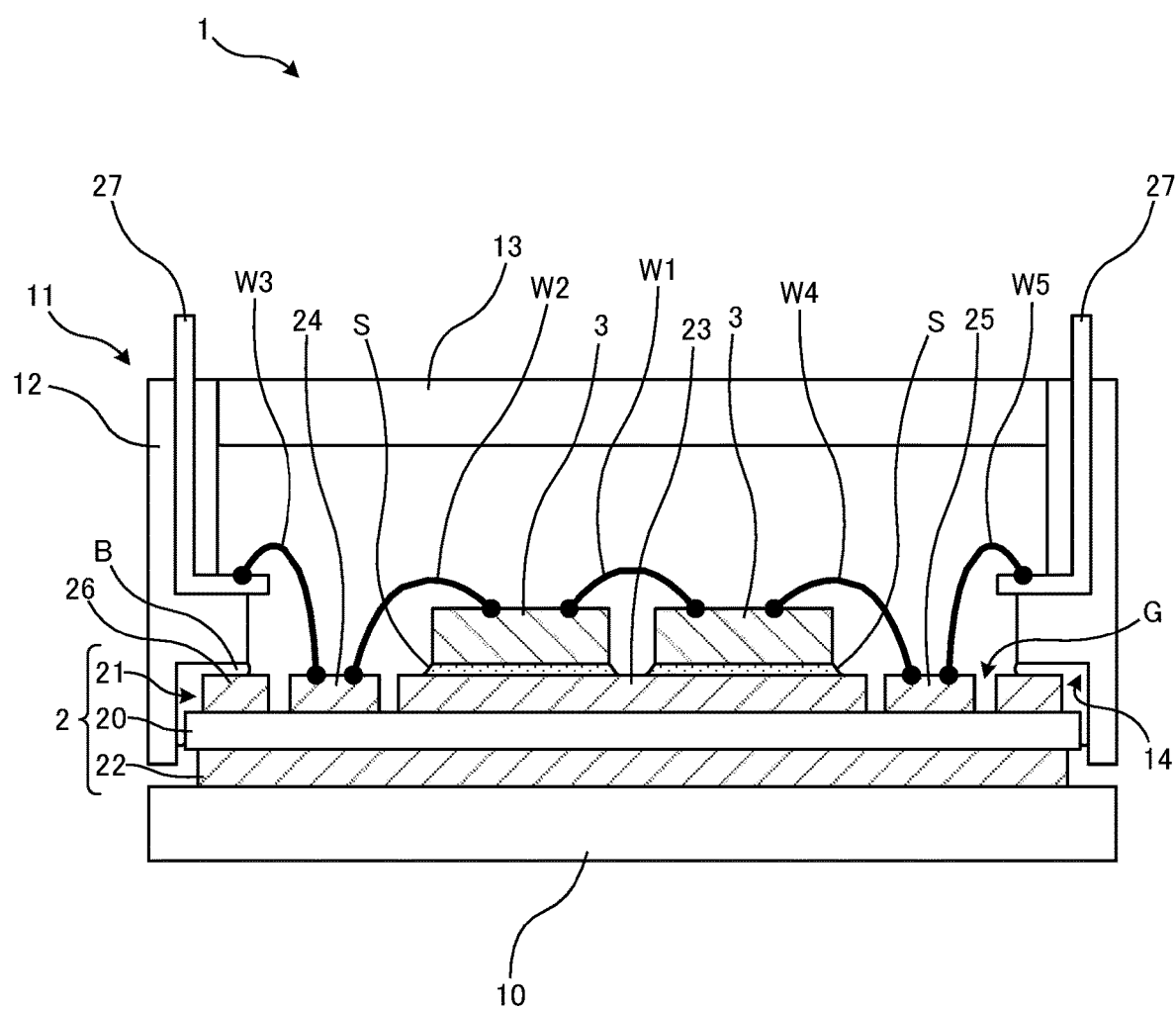
FIG. 2 is a schematic cross-sectional view of the semiconductor device illustrated in FIG. 1, which has been disposed in a heatsink.
Figure 3:
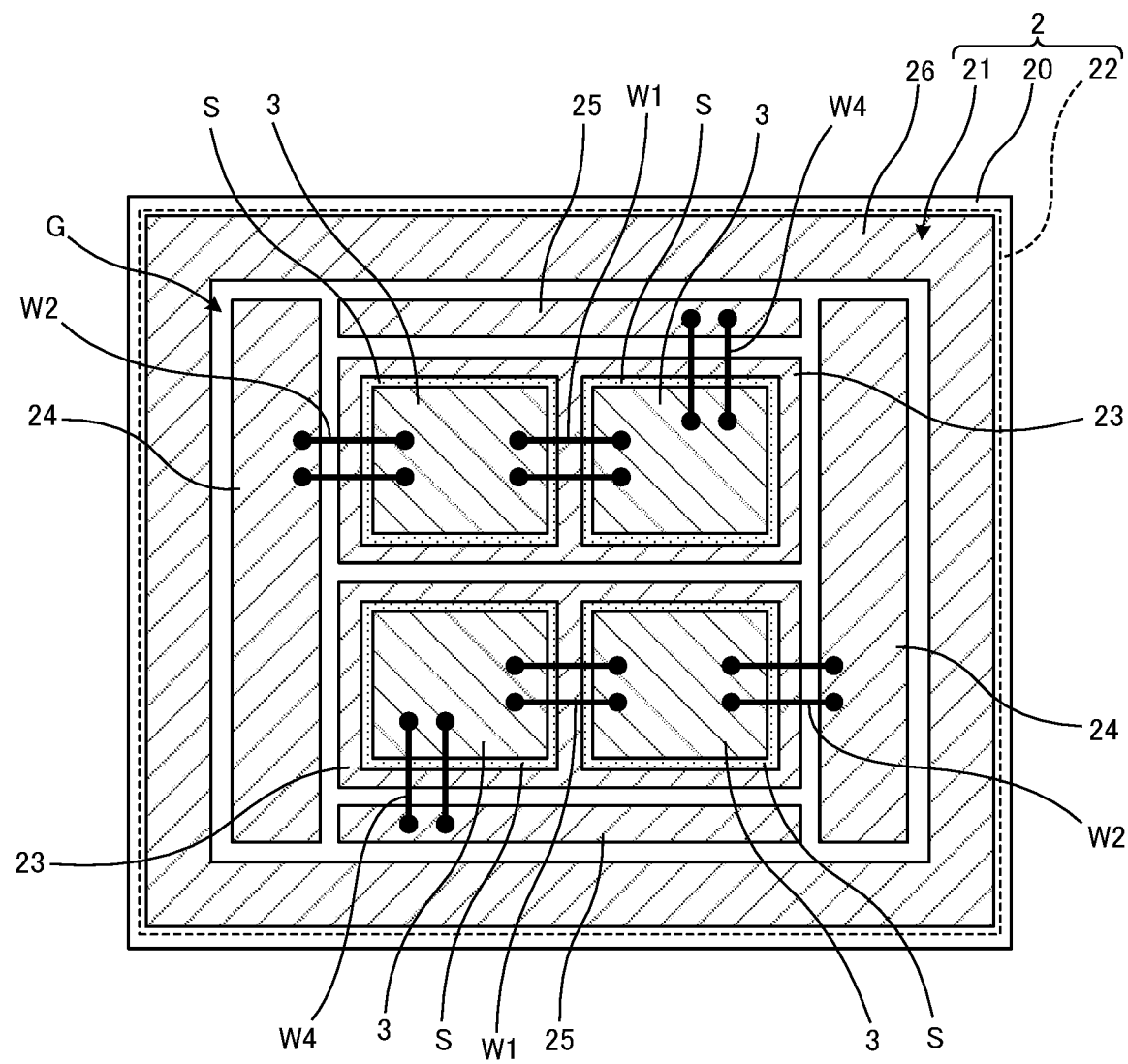
FIG. 3 is a diagram in which the case has been removed from the semiconductor device illustrated in FIG. 1.

Hereinafter, a semiconductor device capable of applying the present invention will be described. FIG. 1 is a schematic plan view illustrating one example of a semiconductor device according to the present embodiment. FIG. 2 is a schematic cross-sectional view of the semiconductor device illustrated in FIG. 1, in which a heatsink has been disposed. FIG. 3 is a diagram in which the case has been removed from the semiconductor device illustrated in FIG. 1. Note that the semiconductor device illustrated below is merely one non-limiting example, and may be modified appropriately.

A semiconductor device 1 is applied to a power conversion device such as a power module, for example. As illustrated in FIGS. 1 to 3, the semiconductor device 1 is configured with semiconductor elements 3 disposed on the top face of an insulating circuit substrate 2. The semiconductor device 1 may be used by disposing the insulating circuit substrate 2 on the top face of a heatsink 10. The heatsink 10 has a square shape in a plan view and is formed using a metal such as copper. The surface of the heatsink 10 is subjected to a plating treatment, for example. A thermally conductive compound may also be interposed between the insulating circuit substrate 2 and the heatsink 10. In the present specification, a plan view means the case of looking at the semiconductor device 1 from a direction perpendicular to the insulating circuit substrate 2.

The insulating circuit substrate 2 is configured by stacking metal layers and insulating layers, and is formed having a square shape in a plan view slightly smaller than the top face of the heatsink 10. Specifically, the insulating circuit substrate 2 has an insulating plate 20 comprising a top face (a first face) and a bottom face (a second face) on the opposite side from the top face, a first metal layer 21 formed on the top face of the insulating plate 20, and a second metal layer 22 formed on the bottom face of the insulating plate 20 (see FIGS. 2 and 3). The thicknesses of the insulating plate 20, the first metal layer 21, and the second metal layer 22 may be the same or may be respectively different.

The insulating plate 20 is formed using an insulator such as ceramic, while the first metal layer 21 and the second metal layer 22 are formed using copper foil for example. The first metal layer 21 contains a plurality of metal patterns. Specifically, as circuit layers electrically connected to semiconductor elements 3, the first metal layer 21 contains a circuit pattern and an annular pattern. The circuit pattern includes first circuit layers 23, second circuit layers 24, third circuit layers 25, and the annular pattern includes an annular layer 26 formed at the perimeter of the circuit layers.

The first circuit layers 23 have a rectangular shape in a plan view, and two are disposed side by side in the lateral direction at the center of the insulating plate 20. The second circuit layers 24 have an elongated shape in a plan view that extends in the lateral direction beside the first circuit layers 23. Two of the second circuit layers 24 are disposed with the two first circuit layers 23 interposed in the longitudinal direction. The third circuit layers 25 have an elongated shape in a plan view that extends in the longitudinal direction beside the first circuit layers 23. Two of the third circuit layers 25 are disposed with the two first circuit layers 23 interposed in the lateral direction. These circuit layers are disposed with slight gaps between each other.

The annular layer 26 has a flat surface and is formed in a quadrilateral ring in a plan view so as to enclose the perimeter of the above circuit layers, with a gap provided between the annular layer 26 and each of the above circuit layers. The outer periphery part of the annular layer 26 is positioned slightly inward from the outer periphery part of the insulating plate 20. Although details will be described later, the annular layer 26 does not function as a circuit pattern, and a plurality of dimples 29 are formed in the top face (see FIG. 4). In the first metal layer 21, the annular layer 26 may be insulated from the first circuit layers 23, the second circuit layers 24, and the third circuit layers 25. Additionally, the annular layer 26 may also be insulated from the second metal layer 22. Also, although details will be described later, a gap G that is annular in a plan view is formed between the annular layer 26 and each of the circuit layers (the circuit layers 23, 24, and 25).

The second metal layer 22 has a flat surface and has a square shape in a plan view that covers substantially all of the bottom face of the insulating plate 20.

Specifically, the outer periphery part of the second metal layer 22 is positioned slightly inward from the outer periphery part of the insulating plate 20 and also slightly outward from the outer periphery part of the annular layer 26. In other words, in a plan view, the entirety of the annular layer 26 overlaps the second metal layer 22. Although details will be described later, a plurality of dimples 28 (see FIG. 4) are formed at spots facing the annular layer 26 on the bottom face of the second metal layer 22.

As described above, in the first metal layer 21, because predetermined gaps are formed between the plurality of circuit layers (the first circuit layers 23, the second circuit layers 24, and the third circuit layers 25) and the annular layer 26, the area in a plan view is small compared to the second metal layer 22. If the thickness of the first metal layer 21 and the thickness of the second metal layer 22 are the same, the volume of the second metal layer 22 is larger than the volume of the first metal layer 21.

The insulating circuit substrate 2 configured in this way may be a direct copper bonding (DCB) substrate or an active metal brazing (AMB) substrate, for example. Also, the insulating plate 20 may be formed using a ceramic material such as alumina ($Al_2O_3$), aluminum nitride (AlN), or silicon nitride ($Si_3N_4$).

The semiconductor elements 3 are disposed on the top face of the first circuit layers 23 of the insulating circuit substrate 2. The semiconductor elements 3 are formed having a square shape in a plan view using a semiconductor substrate such as silicon (Si) or silicon carbide (SiC) for example. With respect to each first circuit layer 23, two semiconductor elements 3 are disposed side by side in the longitudinal direction of the first circuit layer 23. Each of the semiconductor elements 3 is disposed on top of the first circuit layers 23 through a bonding material S such as solder. With this arrangement, the semiconductor elements 3 are electrically connected to the first circuit layers 23.

Note that a switching element such as an insulated-gate bipolar transistor (IGBT) or a power metal-oxide-semiconductor field-effect transistor (power MOSFET), or a diode such as a free-wheeling diode (FWD), is used as the semiconductor element 3. Also, an element such as a reverse-conducting-IGBT (RC-IGBT) that combines an IGBT and an FWD in one, or a reverse-blocking-IGBT (RB-IGBT) having a sufficient withstand voltage with respect to a reverse bias may also be used.

The two semiconductor elements 3 are electrically connected by a wiring member W1. One of the semiconductor elements 3 is electrically connected to a second circuit layer 24 through a wiring member W2. The second circuit layer 24 is electrically connected to an external terminal 27 described later through a wiring member W3. The other semiconductor element 3 is electrically connected to a third circuit layer 25 through a wiring member W4. The third circuit layer 25 is electrically connected to another external terminal 27 through a wiring member W5.

Note that a conducting wire is used for each of the above wiring members. Gold, copper, aluminum, gold alloy, copper alloy, and aluminum alloy can be used either singly or in combination with each other as the material of the conducting wires. Additionally, it is also possible to use a member other than conducting wires as the wiring members. For example, ribbons can be used as the wiring members.

The insulating circuit substrate 2 and the semiconductor elements 3 are covered by a case 11 that acts as a housing enclosing the perimeter. The case 11 includes an annular wall part 12 that encloses an outer perimeter side of the insulating circuit substrate 2 and a lid part 13 that covers the tops of the insulating circuit substrate 2 and the semiconductor elements 3, and is formed using a synthetic resin for example.

The annular wall part 12 is formed in a quadrilateral ring in a plan view corresponding to the insulating plate 20 and the annular layer 26, and stands in the thickness direction (vertical direction) of the insulating circuit substrate 2. The external terminals 27 are embedded into each side that prescribes the quadrilateral ring shape of the annular wall part 12. The external terminals 27 are formed in an L shape in a cross-sectional view, with one end projecting out from the inner wall face of the annular wall part 12 and the other end projecting out from the top face of the annular wall part 12. One end of the external terminal 27 faces the annular layer 26 above the insulating circuit substrate 2.

On the bottom end of the annular wall part 12, a step 14 having a quadrilateral ring shape receptive to the outer periphery part of the insulating circuit substrate 2 is formed. Although details will be described later, the step 14 has an L shape in a cross-sectional view formed by a lower face part 15 and a side face part 16. An adhesive B fills (is applied) to the step 14, and the annular wall part 12 is disposed such that the outer periphery part of the insulating circuit substrate 2 is contained in the step 14. By curing the adhesive B, the annular wall part 12 is made to adhere to the insulating circuit substrate 2. In other words, the annular wall part 12 is affixed to the annular layer 26 through the adhesive B.

Meanwhile, in a so-called copper base-less configuration, in which the copper base that acts as a heat radiation plate for improving heat dissipation is eliminated, a thinner insulating plate that acts as a heat-resistant part is achieved like the semiconductor device described above. However, by taking a copper base-less configuration, it is necessary to dispose the case that acts as a housing directly onto the outer periphery edge of the insulating circuit substrate. For this reason, the circuit pattern formed on the top face of the insulating plate must be moved toward the center, and a region for the adhesion of the case on the outer perimeter of the circuit pattern must be secured.

In this case, a difference may occur between the volume of the metal layer (circuit pattern) formed on the top face of the insulating plate and the volume of the metal layer formed on the bottom face of the insulating plate. Generally, an insulating circuit substrate is a stack of metals and ceramics having different coefficients of linear expansion. For this reason, as the volume difference between the metal layer on the top face side and the metal layer on the bottom face side of the insulating plate increases, the amount of substrate deformation in response to heat change tends to increase. As a result, a large shear stress is produced by the insulating circuit substrate, and durability is degraded. In other words, the heat dissipation and durability of a semiconductor device may be considered to be in a trade-off relation.

Accordingly, the inventor conceived of the present invention in order to achieve heat dissipation and durability of a semiconductor device simultaneously. Specifically, the present embodiment takes a configuration in which the annular layer 26 unrelated to the circuit pattern is formed in the outer perimeter region of the insulating circuit substrate 2 for disposing the case 11, and the case 11 (annular wall part 12) is disposed in the annular layer 26.

According to this configuration, by providing the annular layer 26 that is electrically unrelated to each of the circuit layers (the first circuit layers 23, the second circuit layers 24, and the third circuit layers 25), it is possible to make the volume of the first metal layer 21 on the top face side of the insulating plate 20 approach the volume of the second metal layer 22 on the bottom face side of the insulating plate 20. In other words, the volume difference between the metal layers on the top face side and bottom face side of the insulating plate 20 can be reduced. For this reason, even with a copper base-less configuration with improved heat dissipation, the shear stress associated with thermal deformation can be reduced, making it possible to achieve both heat dissipation and durability simultaneously.

Figure 4A:
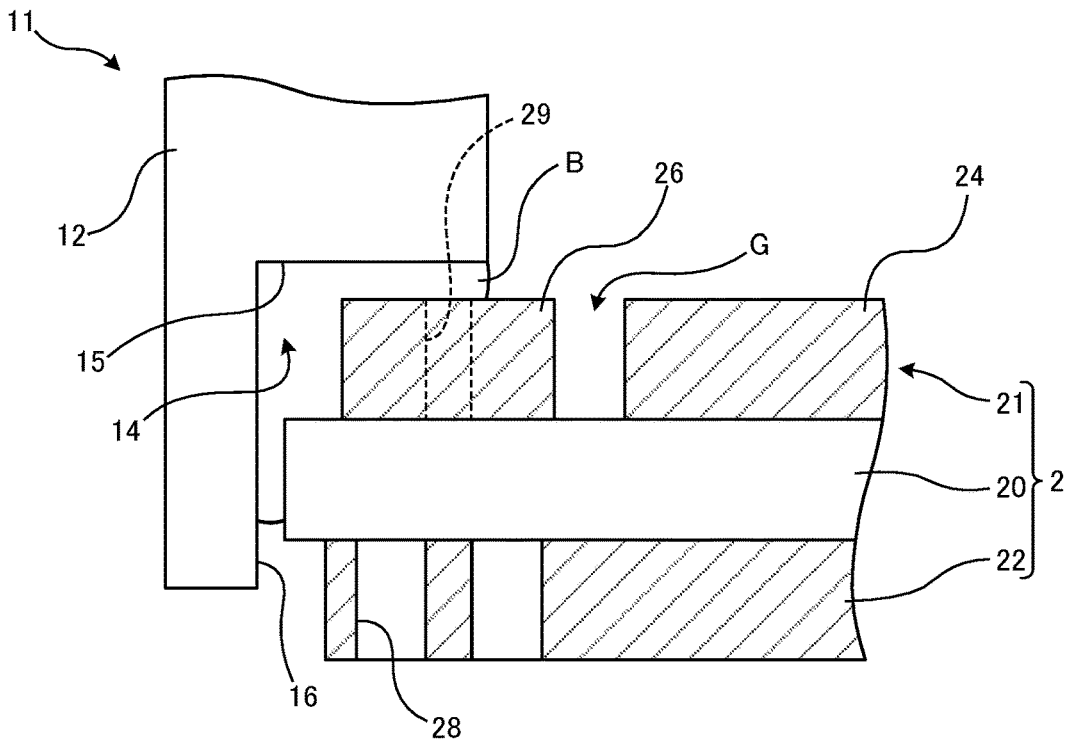
FIG. 4A and FIG. 4B are enlarged views of a portion of the semiconductor device according to the present embodiment.
Figure 4B:
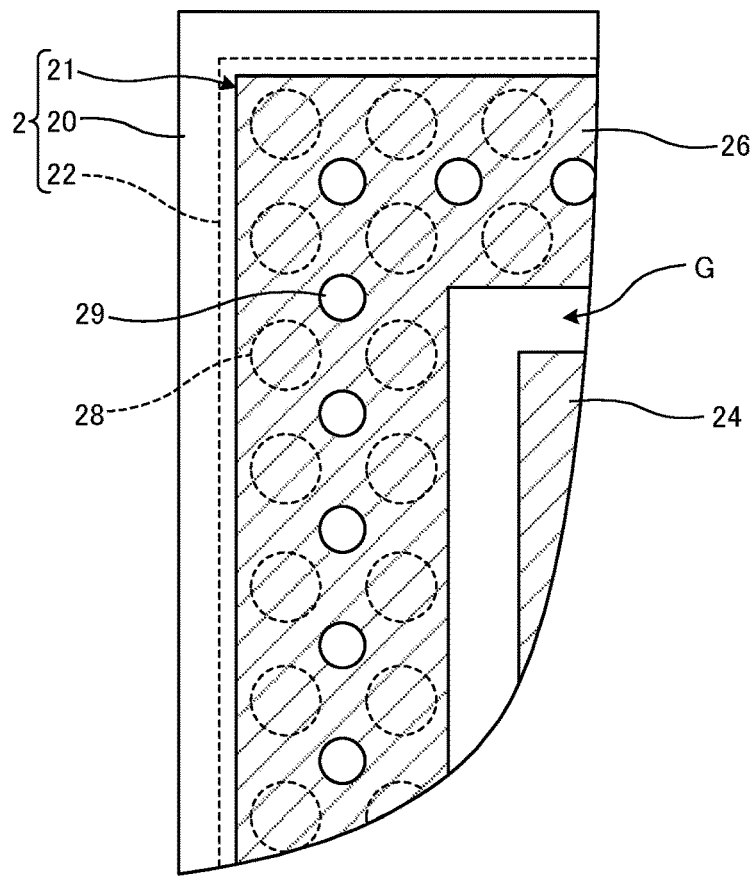

Next, FIG. 4 will be referenced to describe a detailed structure of the semiconductor device according to the present embodiment. FIG. 4 is an enlarged view of a portion of the semiconductor device according to the present embodiment. Specifically, FIG. 4A is an enlarged view of a portion near the annular layer in FIG. 2, and FIG. 4B is an enlarged view of a portion near the annular layer in FIG. 3.

As described above, on the top face of the insulating plate 20, the annular layer 26 is formed on the outer perimeter of a plurality of circuit layers (the first circuit layers 23, the second circuit layers 24, and the third circuit layers 25) so as to enclose the perimeter of the circuit layers with a predetermined gap provided in between. Also, as illustrated in FIGS. 4A and 4B, in the second metal layer 22, a plurality of dimples 28 are formed as first depressions depressed toward the insulating plate 20 at spots facing the annular layer 26. The plurality of dimples 28 are disposed directly underneath the annular layer 26 and overlap with the flat surface of the annular layer 26 in a plan view. More specifically, as illustrated in FIG. 4B, the plurality of dimples 28 are disposed at a predetermined pitch to form two intermittent quadrilateral ring shapes. Also, each dimple 28 is formed to a depth reaching the bottom face of the insulating plate 20.

Also, as described above, in a plan view, an annular gap G is provided between the annular layer 26 and the circuit layers 23, 24, and 25. Preferably, the dimples 28 are not disposed in the second metal layer 22 that faces the annular gap G. In other words, the dimples 28 are preferably not disposed in the second metal layer 22 positioned directly underneath the gap G. In this way, by disposing the gap G and the dimples 28 to not overlap each other in a plan view, a reduction in the rigidity of the insulating plate 20 near the gap G can be suppressed. As a result, the occurrence of cracks in the insulating plate 20 near the gap G can be reduced.

On the other hand, a plurality of dimples 29 are formed as second depressions depressed toward the insulating plate 20 in the annular layer 26. The plurality of dimples 29 overlap with the flat surface of the second metal layer 22 in a plan view. Also, each dimple 29 is formed to a depth reaching the top face of the insulating plate 20. As illustrated in FIG. 4B, the dimples 28 and the dimples 29 are provided at positions that do not overlap each other in a plan view. Also, the number of dimples 28 is greater than the number of dimples 29. Furthermore, the dimples 28 are formed larger than the dimples 29.

Also, as described above, the annular wall part 12 is made to adhere to the outer periphery part of the insulating circuit substrate 2 through the adhesive B. Specifically, an outer periphery edge part of the insulating circuit substrate 2 is entered in the step 14 of the annular wall part 12. The step 14 has a lower face part 15 that faces the top face of the annular layer 26 and a side face part 16 extending downward from the outer perimeter edge of the lower face part 15. The end part of the inner perimeter side of the lower face part 15 is positioned farther inward (toward the center) on the annular layer 26 than the dimples 29. As illustrated in FIG. 4A, the lower end of the side face part 16 extends partway down the thickness of the second metal layer 22, below the bottom face of the insulating plate 20. The adhesive B is entered in between the lower face part 15 and the annular layer 26, and also between the side face part 16 and the insulating plate 20. In other words, the adhesive B reaches the bottoms of the dimples 29.

In this way, in the present embodiment, by forming the plurality of dimples 28 in the second metal layer 22, it is possible to make the volume of the second metal layer 22 approach the volume of the first metal layer 21. In other words, the volume difference between the first metal layer 21 and the second metal layer 22 can be reduced. Therefore, the shear stress associated with thermal deformation can be reduced further, making it possible to improve durability.

Also, by forming the plurality of dimples 29 in the annular layer 26, the surface area of the annular layer 26 can be increased, and by causing the adhesive B to also get inside the dimples 29, the adhesion with the annular wall part 12 can be improved.

Also, by disposing the dimples 28 and the dimples 29 to not overlap each other, it is possible to secure the durability of the insulating circuit substrate 2 without influencing the rigidity of the insulating circuit substrate 2.

As described above, according to the present embodiment, by disposing the annular layer 26 unrelated to the circuit pattern on the top face of the insulating plate 20, it is possible to achieve both heat dissipation and durability of the insulating circuit substrate 2 simultaneously.

Also, the above embodiment takes a configuration in which two semiconductor elements 3 are disposed with respect to one first circuit layer 23, but the embodiment is not limited to this configuration. The number of semiconductor elements 3 may also be one, or three or more.

Also, the above embodiment takes a configuration in which the semiconductor elements 3 are formed in a square shape in a plan view, but the embodiment is not limited to this configuration. The semiconductor elements may also be formed in a polygonal shape other than rectangular.

Also, the above embodiment takes a configuration in which the dimples 28 are formed as the first depressions and the dimples 29 are formed as the second depressions, but the embodiment is not limited to this configuration. For example, continuous or intermittent grooves may be formed instead of dimples. A combination of dimples and grooves is also possible. For example, the first depressions may be configured as dimples and the second depressions may be configured as grooves, or the reverse may be configured. Additionally, the number, size, and depth of the dimples 28 and 29 may be modified appropriately with consideration for the demanded heat dissipation and adhesion.

Also, the above embodiment describes a case where the thickness of each circuit layer and the thickness of the annular layer 26 are the same, but the embodiment is not limited to this configuration. For example, the thickness of the annular layer 26 may be greater than that of each circuit layer. According to this configuration, it is possible to make the volume of the first metal layer 21 further approach the volume of the second metal layer 22, and the durability can be raised further.

Also, the above embodiment describes a case where the first metal layer 21 and the second metal layer 22 have the same thickness and the volume of the second metal layer 22 is greater than the volume of the first metal layer 21, but the embodiment is not limited to this configuration. The second metal layer 22 may also be less thick than the first metal layer 21 insofar as the heat dissipation of the second metal layer 22 can be secured, and the magnitude relationship of the volumes may be equal or may be reversed.

Figure 5A:
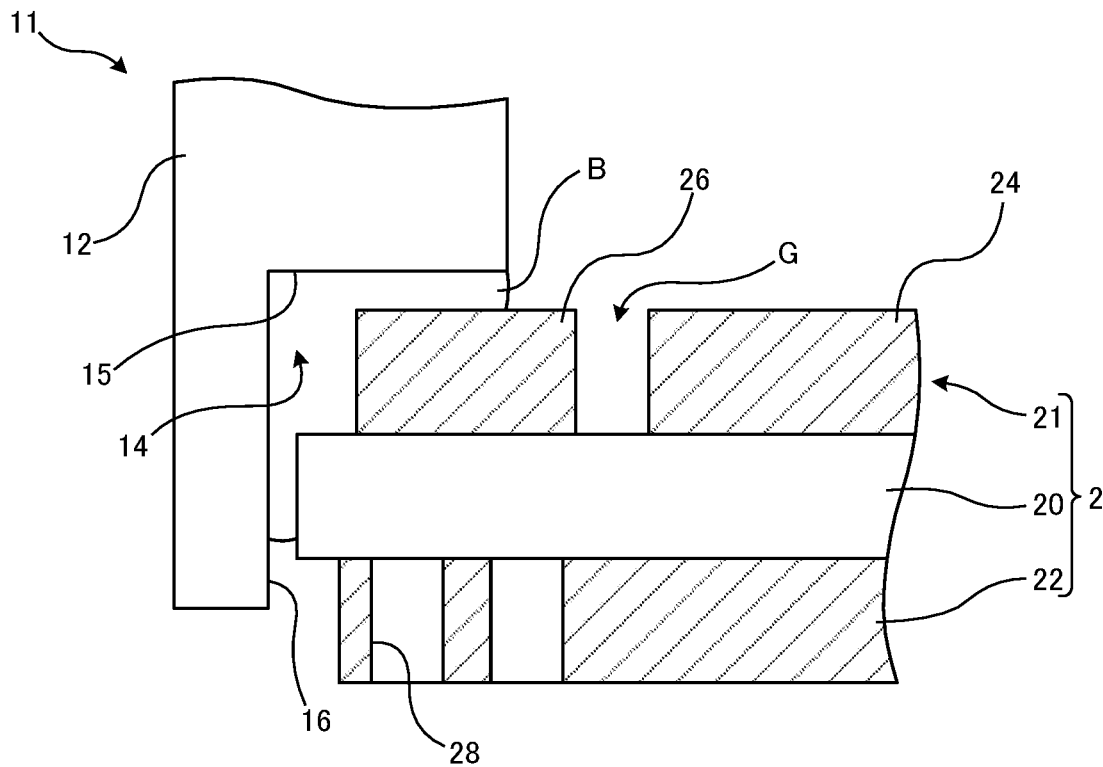
FIG. 5A and FIG. 5B are schematic diagrams illustrating variations of a semiconductor fabrication device according to a modification example.
Figure 5B:
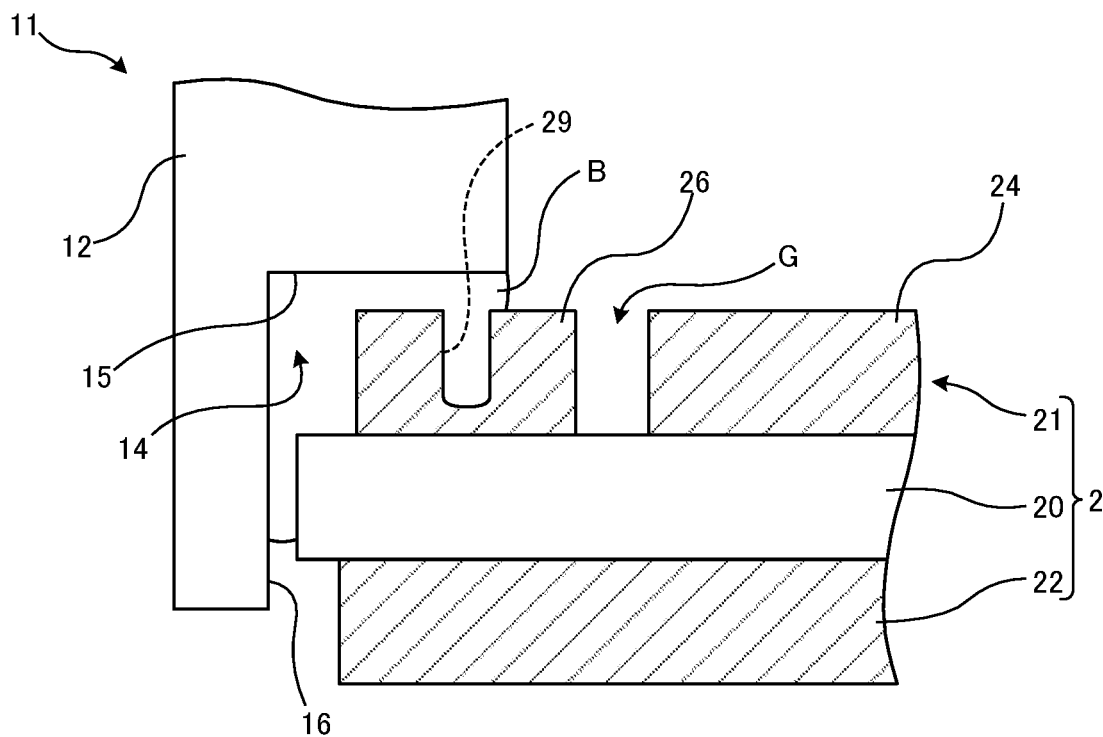

The above embodiment describes a configuration in which dimples are formed in both the second metal layer 22 and the annular layer 26, but the embodiment is not limited to this configuration. A configuration like those illustrated in FIG. 5 is also possible. FIG. 5 is a schematic diagram illustrating variations of a semiconductor device according to a modification example. Specifically, FIG. 5A is an example of forming the dimples 28 only in the second metal layer 22, while FIG. 5B is an example of forming the dimples 29 only in the annular layer 26. In either case, it is still possible to receive the benefit of the effects described above. Particularly, in FIG. 5B, the depth of the dimples 29 does not reach the top face of the insulating plate 20. In this case, the volume of the first metal layer 21 can be made to approach the second metal layer 22 while also improving adhesion with the dimples 29, and the durability of the insulating circuit substrate 2 can be secured.

Figure 6A:
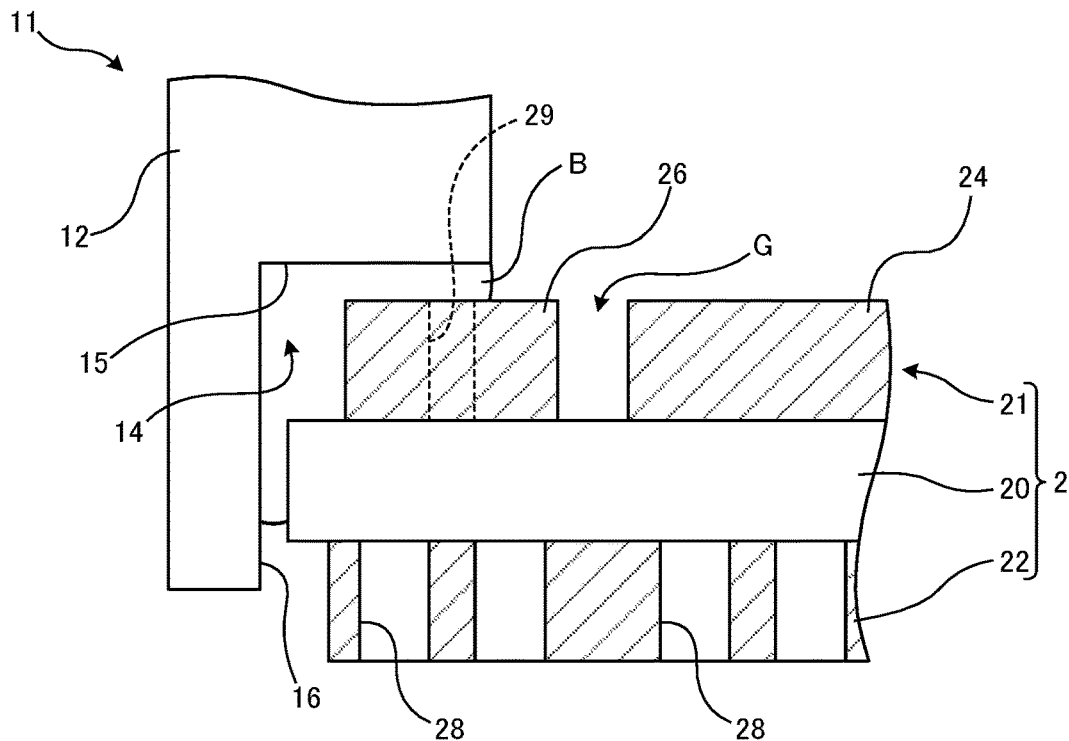
FIG. 6A and FIG. 6B are schematic diagrams illustrating variations of a semiconductor device according to a modification example.
Figure 6B:
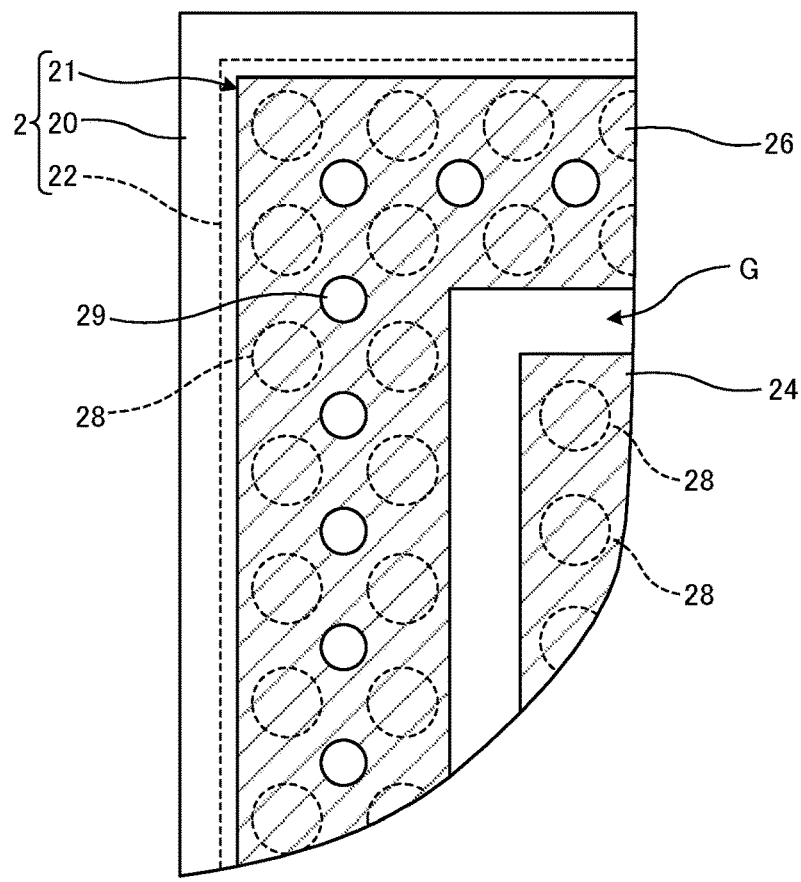

The above embodiment describes the semiconductor device 1 provided with the plurality of dimples 28 in the region of the second metal layer 22 that overlaps with the annular layer 26 in a plan view. The arrangement of the dimples 28 is not limited to this embodiment. A configuration like the one illustrated in FIG. 6 is also possible. FIG. 6 is a schematic diagram illustrating variations of a semiconductor device according to a modification example. Specifically, FIG. 6A is an enlarged cross-sectional view of a portion of the semiconductor device, while FIG. 6B is an enlarged plan view of a portion of the semiconductor device. Like the above embodiment, in the modification example illustrated in FIGS. 6A and 6B, the annular gap G is provided between the annular layer 26 and the circuit layers 23, 24, and 25, and is demarcated by the annular layer 26, the circuit layers 23, 24, and 25, and the insulating plate 20 in a plan view. The dimples 28 are provided in the region of the second metal layer 22 that overlaps with the annular layer 26 and in the region of the second metal layer 22 that overlaps with the circuit layers 23, 24, and 25 in a plan view. Also, the dimples 28 are not provided in the second metal layer 22 that faces the annular gap G. By disposing the dimples 28 in this way, it is possible to decrease the volume of the second metal layer 22 further and approach the volume of the first metal layer 21. As a result, the volume difference between the first metal layer 21 and the second metal layer 22 can be reduced.

In addition, the present embodiment and modification examples have been described, but the above embodiment and the modification examples may also be combined in full or in part and treated as another embodiment.

Also, the present embodiment is not limited to the above embodiment and modification examples, and various modifications, substitutions, and alterations are possible without departing from the scope of the gist of the technical idea. Further, if the technical idea can be achieved according to another method through the advancement of the technology or another derivative technology, the technical idea may be implemented using the method. Consequently, the claims cover all embodiments and aspects which may be included in the scope of the technical idea.

Features of the above embodiment are summarized below.

A semiconductor device according to the embodiment comprises: an insulating circuit substrate including an insulating plate, a first metal layer formed on a top face of the insulating plate, and a second metal layer formed on a bottom face of the insulating plate; a semiconductor element disposed on a top face of the first metal layer through a bonding material; and a housing that encloses a perimeter of the insulating circuit substrate and the semiconductor element, wherein the first metal layer includes a circuit layer electrically connected to the semiconductor element and an annular layer formed to enclose a perimeter of the circuit layer with a gap provided with respect to the circuit layer, and the second metal layer has a first depression depressed toward the insulating plate at a spot that faces the annular layer, and the housing is affixed to the annular layer through an adhesive.

Also, in the semiconductor device according to the embodiment, the annular layer has a flat surface, and in a plan view, the annular layer and the second metal layer overlap at least partially, and additionally, the first depression and the flat surface of the annular layer overlap.

Also, in the semiconductor device according to the embodiment, the annular layer has a second depression depressed toward the insulating plate.

Also, a semiconductor device according to the embodiment comprises: an insulating circuit substrate including an insulating plate, a first metal layer formed on a top face of the insulating plate, and a second metal layer formed on a bottom face of the insulating plate; a semiconductor element disposed on a top face of the first metal layer through a bonding material; and a housing that encloses a perimeter of the insulating circuit substrate and the semiconductor element, wherein the first metal layer includes a circuit layer electrically connected to the semiconductor element and an annular layer formed to enclose a perimeter of the circuit layer with a gap provided with respect to the circuit layer, the annular layer has a second depression depressed toward the insulating plate, and the housing is affixed to the annular layer through an adhesive.

Also, in the semiconductor device according to the embodiment, the second metal layer has a flat surface, and in a plan view, the annular layer and the second metal layer overlap at least partially, and additionally, the second depression and the flat surface of the second metal layer overlap.

Also, in the semiconductor device according to the embodiment, the second metal layer has a first depression depressed toward the insulating plate at a spot that faces the annular layer.

Also, in the semiconductor device according to the embodiment, a volume of the second metal layer is greater than a volume of the first metal layer.

Also, in the semiconductor device according to the embodiment, the first depression and the second depression are provided at non-overlapping positions in a plan view.

Also, in the semiconductor device according to the embodiment, the first depression and/or the second depression are formed by a plurality of dimples and/or grooves.

Also, in the semiconductor device according to the embodiment, the first depression and the second depression are formed by a plurality of dimples, and a number of the first depressions is greater than a number of the second depressions.

Also, in the semiconductor device according to the embodiment, a thickness of the annular layer is greater than a thickness of the circuit layer.

INDUSTRIAL APPLICABILITY

As described above, the present invention has an effect whereby both heat dissipation and durability can be achieved simultaneously, and is particularly useful for a semiconductor device and a semiconductor device manufacturing method.

This application is based on Japanese Patent Application No. 2018-230623 filed on Dec. 10, 2018, the content of which is hereby incorporated in its entirety.

What is claimed is:

1. A semiconductor device, comprising:
an insulating circuit substrate including an insulating plate, a first metal layer formed on a top surface of the insulating plate, and a second metal layer formed on a bottom surface opposite to the top surface of the insulating plate, the first metal layer having a top surface and a bottom surface opposite to the top surface thereof and facing the top surface of the insulating plate, the second metal layer having a top surface facing the bottom surface of the insulating plate and a bottom surface opposite to the top surface thereof;
a semiconductor element disposed on the top surface of the first metal layer through a bonding material; and
a housing that encloses the insulating circuit substrate and the semiconductor element, wherein
the first metal layer includes a circuit pattern electrically connected to the semiconductor element, and an annular pattern surrounding the circuit pattern with a gap provided with respect to the circuit pattern,
the second metal layer has, as a first depression, a portion that is recessed from the bottom surface thereof toward the top surface thereof, the top surface facing the annular layer in a plan view, and
the housing is affixed to the annular pattern through an adhesive.

2. The semiconductor device according to claim 1, wherein
the annular pattern has a flat surface, and
in the plan view, the annular pattern and the second metal layer at least partially overlap, and additionally, the first depression of the second metal layer is overlapped by the flat surface of the annular pattern.

3. The semiconductor device according to claim 1, wherein
the annular pattern has, as a second depression, a portion that is recessed from a top surface thereof toward a bottom surface thereof, the bottom surface being opposite to the top surface of the annular pattern and facing the top surface of the insulating plate.

4. The semiconductor device according to claim 3, wherein a volume of the second metal layer is greater than a volume of the first metal layer.

5. The semiconductor device according to claim 3, wherein
the first depression and the second depression are non-overlapping in a plan view.

6. The semiconductor device according to claim 1, wherein
a thickness of the annular pattern is greater than a thickness of the circuit pattern.

7. A semiconductor device, comprising:
an insulating circuit substrate including an insulating plate, a first metal layer formed on a top surface of the insulating plate, and a second metal layer formed on a bottom surface opposite to the top surface of the insulating plate, the first metal layer having a top surface and a bottom surface opposite to the top surface thereof and facing the top surface of the insulating plate, the second metal layer having a top surface facing the bottom surface of the insulating plate and a bottom surface opposite to the top surface thereof;
a semiconductor element disposed on a top surface of the first metal layer through a bonding material; and
a housing that encloses the insulating circuit substrate and the semiconductor element, wherein
the first metal layer includes a circuit pattern electrically connected to the semiconductor element, and an annular pattern surrounding the circuit pattern with a gap provided with respect to the circuit pattern,
the annular pattern has, as a one depression, a portion that is recessed from a top surface thereof toward a bottom surface thereof, the bottom surface being opposite to the top surface of the annular pattern and facing the insulating plate, and
the housing is affixed to the annular pattern through an adhesive.

8. The semiconductor device according to claim 7, wherein
the second metal layer has a flat surface, and
in a plan view, the annular pattern and the second metal layer at least partially overlap, and additionally, the one depression is overlapped by the flat surface of the second metal layer.

9. The semiconductor device according to claim 7, wherein
the second metal layer has, as an other depression, a portion that is recessed from the bottom surface thereof toward the top surface thereof, the top surface facing the annular layer in a plan view.

10. The semiconductor device according to claim 9, wherein
a volume of the second metal layer is greater than a volume of the first metal layer.

11. The semiconductor device according to claim 9, wherein
the one depression and the other depression are non-overlapping in a plan view.

12. The semiconductor device according to claim 9, wherein
at least one of the one depression or the other depression is formed by a plurality of dimples and/or grooves.

13. The semiconductor device according to claim 9, wherein
each of the one depression and the other depress is formed by a plurality of dimples, and
a total number of the dimples of the one depression is greater than a total number of the dimples of the other depression.

14. The semiconductor device according to claim 7, wherein
a thickness of the annular pattern is greater than a thickness of the circuit pattern.

* * * * *